United States Patent [19]
Nishimura

[11] Patent Number: 6,111,784
[45] Date of Patent: Aug. 29, 2000

[54] MAGNETIC THIN FILM MEMORY ELEMENT UTILIZING GMR EFFECT, AND RECORDING/REPRODUCTION METHOD USING SUCH MEMORY ELEMENT

[75] Inventor: Naoki Nishimura, Tokyo, Japan

[73] Assignee: Canon Kabushiki Kaisha, Tokyo, Japan

[21] Appl. No.: 09/154,859

[22] Filed: Sep. 16, 1998

[30] Foreign Application Priority Data

| Sep. 18, 1997 | [JP] | Japan | ................................ 9-253531 |
| Jun. 5, 1998 | [JP] | Japan | ............................... 10-157806 |
| Sep. 10, 1998 | [JP] | Japan | ............................... 10-256965 |

[51] Int. Cl.[7] .................................................. G11C 11/15
[52] U.S. Cl. ........................... 365/173; 365/171; 365/158
[58] Field of Search .................................. 365/171, 172, 365/173, 129, 158

[56] References Cited

U.S. PATENT DOCUMENTS

| 5,173,873 | 12/1992 | Wu et al. | 365/173 |
| 5,477,482 | 12/1995 | Prinz | 365/129 |
| 5,541,868 | 7/1996 | Prinz | 365/98 |
| 5,587,974 | 12/1996 | Nishimura | 369/13 |
| 5,589,040 | 12/1996 | Nishimura | 204/192.26 |
| 5,616,428 | 4/1997 | Nishimura et al. | 428/694 |
| 5,656,384 | 8/1997 | Nishimura et al. | 428/694 |
| 5,663,935 | 9/1997 | Nishimura | 369/13 |
| 5,666,346 | 9/1997 | Nishimura | 369/275.2 |
| 5,717,662 | 2/1998 | Nishimura | 369/13 |
| 5,719,829 | 2/1998 | Nishimura | 369/13 |
| 5,732,049 | 3/1998 | Nishimura | 369/13 |
| 5,774,429 | 6/1998 | Nishimura | 369/13 |
| 5,790,513 | 8/1998 | Hiroki et al. | 369/275.2 |
| 5,810,979 | 9/1998 | Nishimura et al. | 204/192.2 |
| 5,830,589 | 11/1998 | Nishimura | 428/694 |
| 5,862,105 | 1/1999 | Nishimura | 369/13 |
| 5,889,739 | 3/1999 | Nishimura et al. | 368/13 |
| 5,968,181 | 6/1998 | Zhu et al. | 365/158 |

OTHER PUBLICATIONS

H. Sakakima, et al., "GMR—Solidstate Memory Using GMR Films", Journal of the Magnetics Society of Japan, vol. 20, pp. 22–26, 1996.

*Primary Examiner*—David Nelms
*Assistant Examiner*—Hoai V. Ho
*Attorney, Agent, or Firm*—Fitzpatrick, Cella, Harper & Scinto

[57] ABSTRACT

It provides a magnetic thin film memory element utilizing the GMR effect. The memory element comprising a first magnetic layer with a closed magnetic circuit structure, a second magnetic layer with a closed magnetic circuit structure having a coercive force higher than that of the first magnetic layer, and a non-magnetic layer disposed between the first and second magnetic layers, at least a part of which is made of an insulating material. It also discloses methods for recording and reproducing information in and from such memory element.

12 Claims, 8 Drawing Sheets

MAGNETIC THIN FILM MEMORY ELEMENT UTILIZING GMR EFFECT, AND RECORDING/REPRODUCTION METHOD USING SUCH MEMORY ELEMENT

BACKGROUND OF THE INVENTION

1. Field of the Invention

The present invention relates to a magneto-resistive element for recording information with orientation of magnetization and reproducing it with a magneto-resistive effect, and a magnetic thin film memory using it.

2. Related Background Art

Figure 1:
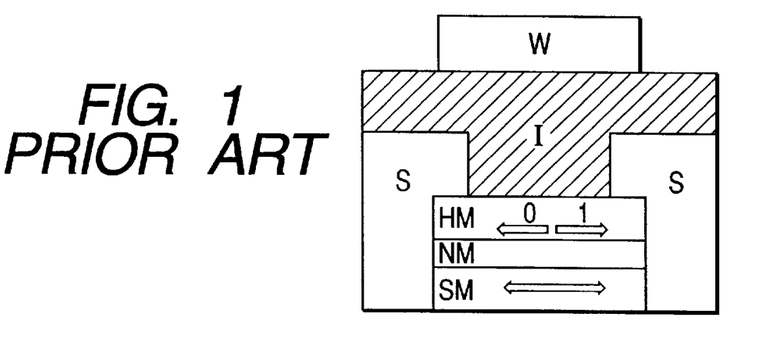
FIG. 1 is a sectional view of a magnetic thin film for illustrating a conventional magnetic thin film memory utilizing a giant magneto-resistive effect.
Figure 2A:
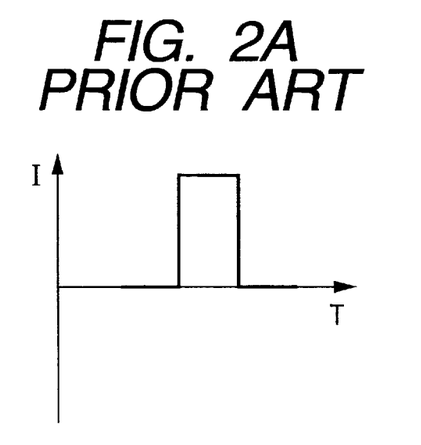
Figure 2B:
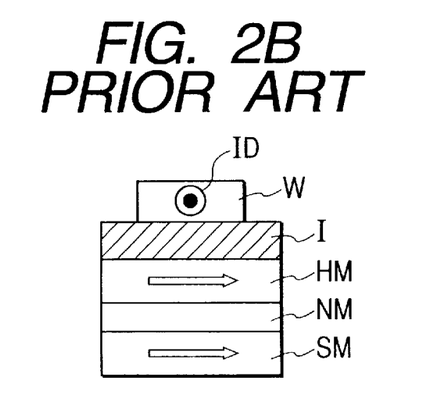
Figure 2C:
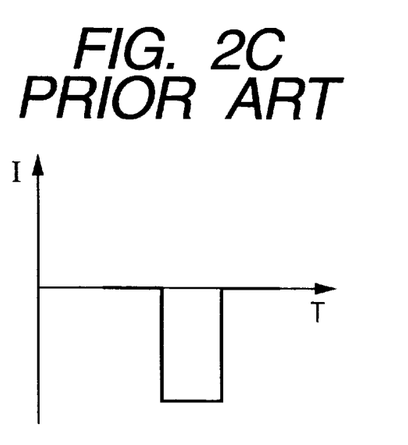
Figure 2D:
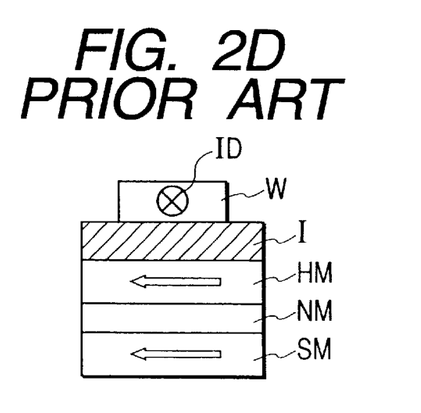
Figure 3A:
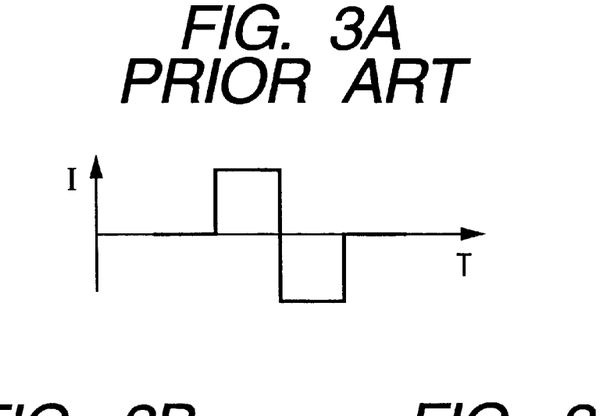
Figure 3B:
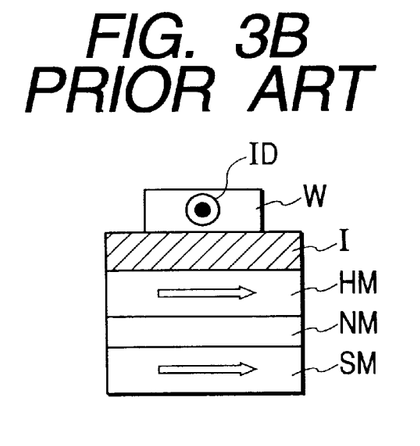
Figure 3C:
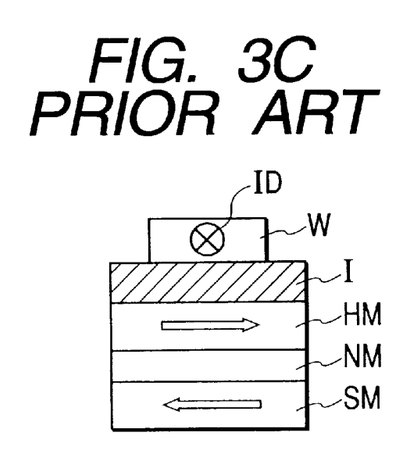
Figure 3D:
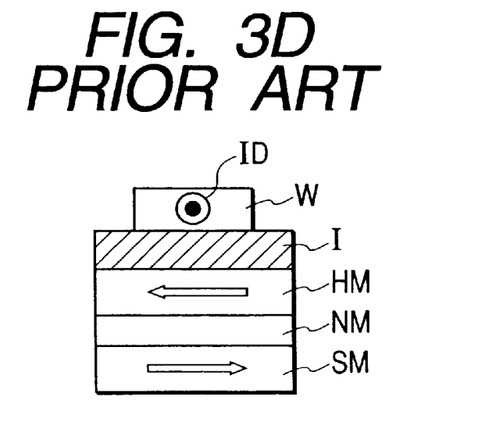
Figure 3E:
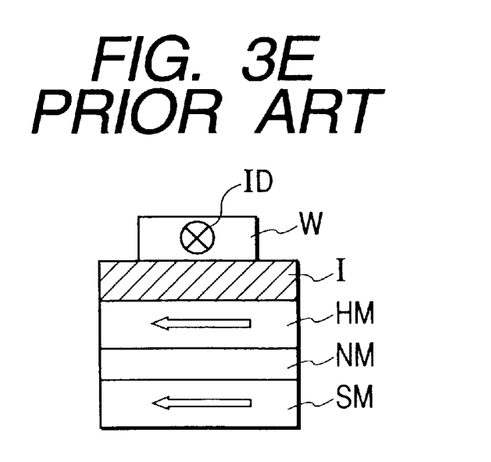

The magnetic thin film memory is a solid-state memory without moving parts as in a semiconductor memory, and has such advantages over the semiconductor memory that information is not lost even if the power supply is shut down, that it allows infinite number of repeated rewriting, and that there is no risk for information to be lost when it is radiated by radiation. In recent years, a thin film magnetic memory utilizing the giant magneto-resistive effect particularly attracts attention since it can provide higher output than a magnetic thin film memory which has been proposed and uses an anisotropic magneto-resistive effect. For example, the Journal of the Magnetics Society of Japan, Vol. 20, p.22 (1996) proposed a solid-state memory which was constructed, as shown in FIG. 1, by stacking components consisting of a hard magnetic film HM/non-magnetic film NM/soft magnetic film SM to constitute a memory element. This memory element is provided with a sense line S joined to a metal conductor and a word line W insulated from the sense line S by an insulating film I, and information is written by a magnetic field generated by currents through the word and sense lines. Specifically, as shown in FIGS. 2A to 2D, memory states "0" and "1" are recorded by supplying a current I through the word line W to generate a magnetic field with different orientation depending on difference of a current direction ID, thereby inverting magnetization of the hard magnetic film HM. For example, as shown in FIGS. 2A and 2B, "1" is recorded in the hard magnetic film HM by supplying a positive current to generate a magnetic field toward the right, while, as shown in FIGS. 2C and 2D, "0" is recorded in the hard magnetic film HM by supplying a negative current to generate a magnetic field toward the left. Reading of information is performed by supplying a current I smaller than the recording current through the word line W to invert magnetization of only the soft magnetic film SM, and by measuring variation of resistance in the film. When the giant magneto-resistive effect is utilized, different resistance values are generated in the case where the magnetization of the soft and hard magnetic films SM and HM is parallel and in the case where it is anti-parallel, so that the memory states of "1" and "0" can be determined from variation of resistance in each case. When a positive-to-negative pulse as shown in FIG. 3A is applied, the orientation of the soft magnetic film is changed from right to left, so that its resistance value for the memory state "1" changes from a small value as shown in FIG. 3B to a large value as shown in FIG. 3C, while it for the memory state "0" changes from a large value as shown in FIG. 3D to a small value as shown in FIG. 3E. When the resistance variation is thus read, information recorded in the hard magnetic film HM can be read regardless of the state of magnetization in the soft magnetic film SM after recording, so that non-destructive reading can be attained.

However, in the magnetic thin film memory with the above arrangement, an anti-magnetic field (self-demagnetizing field) generated in the magnetic layer cannot be negligible as the area of bit cell is reduced, so that the magnetization is not fixed in one orientation and becomes unstable for the magnetic layer for holding the record. Therefore, the magnetic thin film memory with the above arrangement has a disadvantage that information cannot be saved when the bit cell is miniaturized, so that it cannot be highly integrated.

SUMMARY OF THE INVENTION

The present invention is intended in view of these points to attain a magnetic thin film memory from which an anti-magnetic field causing a problem in miniaturizing bit cells is eliminated, and which can be highly integrated.

Then, the above object can be achieved by a magnetic thin film memory element comprising:

- a first magnetic layer with a closed magnetic circuit structure;
- a second magnetic layer with a closed magnetic circuit structure having a coercive force higher than that of the first magnetic layer; and
- a non-magnetic layer disposed between the first and second magnetic layers, at least a part of which is made of an insulating material.

In addition, it can be achieved by an information recording method comprising the step of supplying a current with different direction depending on information to a current path of the magnetic thin film memory element, thereby recording the information in the first magnetic layer.

Furthermore, it can be achieved by an information reproduction method comprising the steps of supplying a current between the first and second magnetic layers of the magnetic thin film memory element, and measuring resistance, thereby reproducing information recorded on the first magnetic layer.

Detailed description is given in connection with the embodiments which follow.

BRIEF DESCRIPTION OF THE DRAWINGS

FIGS. 2A, 2B, 2C and 2D are diagrams showing a recording operation of a conventional magnetic thin film memory using the giant magneto-resistive effect, in which FIGS. 2A and 2C show response of a word current I at time T, while FIGS. 2B and 2D show state of magnetization in the conventional magnetic thin film memory;

FIGS. 3A, 3B, 3C, 3D and 3E are diagrams showing a recording operation of a conventional magnetic thin film memory using the giant magneto-resistive effect, in which FIG. 3A shows response of a word current I at time T, while FIGS. 3B to 3E show state of magnetization in the conventional magnetic thin film memory;

DETAILED DESCRIPTION OF THE PREFERRED EMBODIMENTS

[First Embodiment]

Figure 4A:
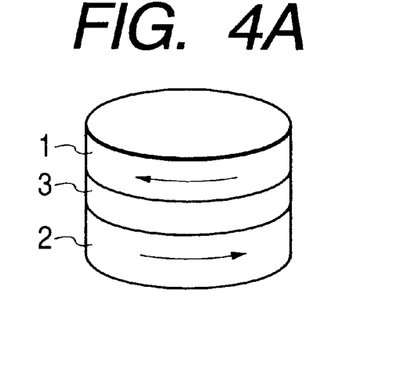
FIGS. 4A and 4B are perspective views for illustrating a thin magnetic film memory element according to an embodiment of the present invention.
Figure 4B:
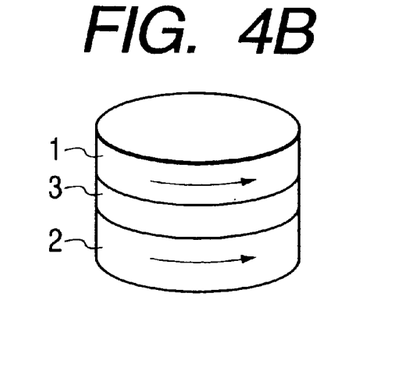

FIGS. 4A and 4B show an example of magnetic thin film memory element of the present invention which is cylindrical in the figures. In the figures, there are shown a first magnetic layer 1, a second magnetic layer 2, and a non-magnetic layer 3, for which layer 3 an insulating material is used so as to cause a spin tunnel effect as described later. An arrow represents orientation of magnetization in each magnetic layer. The first and second magnetic layers are of cylindrical, and have a clockwise or counterclockwise axis of easy magnetization. Their magnetizations are annularly oriented along the cylinder. Thus, unlike the medium described in the Prior Art section, a magnetic pole is not exposed at the end surface, so that magnetization can be stably saved.

Magnetized information of "0" and "1" is recorded whether the orientation of magnetization for the first magnetic layer is clockwise or counterclockwise. For example, the first magnetic layer has a low coercive force so as to be able to record magnetized information corresponding to "0" in FIG. 4A and "1" in FIG. 4B.

The second magnetic layer has a coercive force higher than the first magnetic layer. Its magnetization orientation does not depend on the magnetized information, but is oriented in a predetermined direction, and is constantly maintained in saving, recording and reproducing.

In addition, the magnetic thin film memory element of the present invention exhibits a low resistance value when the magnetization of the first and second magnetic layers is in parallel, and a high resistance value when it is in anti-parallel. Thus, the memory element has a different resistance value depending on the magnetization orientation of the first magnetic layer, so that recorded magnetized information can be read.

Figure 5A:
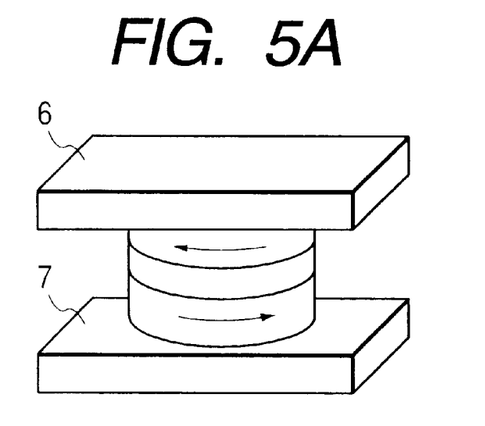
FIGS. 5A and 5B are perspective views for illustrating state of magnetization in a magnetic thin film memory element according to an embodiment of the present invention.
Figure 5B:
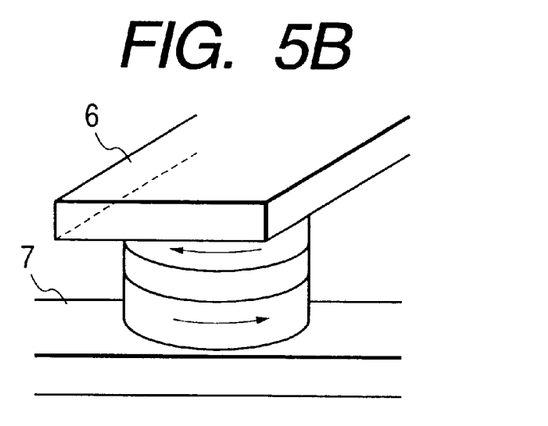

Used for the memory element of the present invention is a giant magneto-resistive element of a spin tunnel type. This is because of the following reasons. First, the spin tunnel type can provide a large magneto-resistive (MR) ratio. While an MR ratio of only about 10% is obtained from a magneto-resistive element of spin scattering type in which a non-magnetic layer of good conductor such as copper is held between magnetic layers, an MR ratio of about 20–30% can be obtained from the spin tunnel type at the room temperature, thereby a large signal can be obtained in reading. Second, the magneto-resistive element of spin tunnel type can increase its resistance value to as high as 1 k$\Omega$. When the memory elements of the present invention are arranged in a matrix for operation, a semiconductor switching element is connected to the memory element. If resistance of the memory element is lower than on-resistance (about 1 k$\Omega$) of the semiconductor switching element, reading of information recorded in the memory element becomes unstable under influence of variation of on-resistance. Third, the spin tunnel type can use a CPP (Current Perpendicular to the film Plane)-MR (Magneto-Resistance) effect which causes current to flow perpendicular to the film surface. This is because in mounting a terminal on the memory element, attaching electrode wires 6 and 7 on and under the memory element as in the present invention as shown in FIGS. 5A and 5B provides surer contact between the memory element and the electrode wire than attaching the terminal to the side of memory element. With this regard, although magneto-resistance with the CPP-MR effect can be also observed on the magneto-resistive element of spin scattering type, it is unsuitable for the memory element. This is because that while the magneto-resistive element of spin scattering type has as low resistance value as several tens ohms even if current is caused to flow parallel to the film surface, the resistance value is decreased by further one order or more if the CPP-MR effect is used, so that reading cannot be accurately performed as described above.

As described above, the magnetic thin film memory element of the present invention is characterized in that the magneto-resistive effect is generated with the spin tunnel type. The magneto-resistive effect by the spin tunneling provides a structure of first magnetic layer/non-magnetic layer/second magnetic layer as shown, for example, in FIGS. 4A and 4B, and a thin insulating material is used for the non-magnetic layer. Then, it is arranged that an electron tunnel phenomenon occurs from the first magnetic layer to the second magnetic layer when current is caused to flow perpendicular to the film surface in reproduction.

In the magnetic thin film memory element of spin tunnel type of the present invention, since conduction electrons is spin-polarized in ferromagnetic metal, upward spin and downward spin have different electron states on the Fermi surface. When a ferromagnetic tunnel junction consisting of a ferromagnetic material, an insulating material and a ferromagnetic material is constituted from such ferromagnetic metal layer, the conduction electron tunnels while maintaining its spin, so that the tunnel probability varies depending on the state of magnetization of both magnetic layers, which appears as variation of tunnel resistance. This decreases resistance when the magnetization of the first and second magnetic layers is parallel, and increases resistance when it is anti-parallel. Since larger difference between the state densities of the upward and downward spins increased the resistance value, and a larger reproduction signal is obtained, it is desirable to use a magnetic material with high spin polarizability for the first and second magnetic layers. Specifically, Fe with much polarization of upward and downward spins on the Fermi surface is chosen for the first and second magnetic layers, and Co is chosen as a secondary component. More specifically, it is desirable to choose and use a material containing Fe, Co or Ni as primary component. Preferably, it is Fe, Co, FeCo, NiFe, and NiFeCo. The preferable elemental structure of NiFe is x equal to 0 but 82 or less for $Ni_xFe_{100-x}$. More, specifically, it includes Fe, Co, $Ni_{72}Fe_{28}$, $Ni_{51}Fe_{49}$, $Ni_{42}Fe_{58}$, $Ni_{25}Fe_{75}$, and $Ni_9Fe_{19}$.

In addition, NiFe, NiFeCo or Fe is more desirable for the first magnetic layer to decrease the coercive force. Moreover, a material primarily containing Co is desirable for the second magnetic layer to increase the coercive force.

As described above, since the magneto-resistive memory element of the present invention uses the magneto-resistive effect from spin tunneling, the non-magnetic layer must be an insulating layer for the electron to tunnel while maintaining its spin. The non-magnetic film may be entirely or partially an insulating layer. The magneto-resistive effect can be further increased by constituting the non-magnetic layer partially with an insulating layer to minimize its thickness. An example using an oxide film as the non-magnetic metal film includes an $Al_2O_3$ film which is an Al film a part of which is oxidized in the air. The non-magnetic layer is made of an insulating material, preferably, aluminum oxide AlOx, aluminum nitride AlNx, silicon oxide SiOx, and silicon nitride SiNx. NiOx may be used as the primary component. Since suitable potential barrier should exist in the energy of conduction electron in the first and second magnetic layers for piston tunneling, the above-mentioned materials are relatively easy to obtain such barrier, and advantageous in manufacturing.

Each of the first and second magnetic layers of the magnetic thin film memory element according to the present invention desirably has a film thickness thicker than 100 angstrom but 5000 angstrom or less. First, when an oxide is used for the non-magnetic layer, magnetism at the interface of the magnetic layer close to the non-magnetic layer is weakened due to effect of the oxide, and this effect is high when the film is thin. Second, when the aluminum oxide non-magnetic layer is formed by forming a film of Al, and then introducing oxygen for oxidization, aluminum remains several tens angstrom, and this effect becomes significant when the magnetic layer is 100 angstrom or less, so that suitable memory characteristic cannot be obtained. Third, particularly when the memory element is miniaturized to a submicron order, there is caused attenuation for the memory holding capability of the first magnetic layer, and the capability for holding constant magnetism for the second magnetic layer. Since, if it is too thick, there is such a problem as the resistance value becomes too high, it is desirable to be 5000 angstrom or less, and, more desirable to be 1000 angstrom or less.

In addition, it is desired that the non-magnetic layer is a uniform layer of about several tens angstrom, and that the film thickness at its insulating portion is 5 angstrom or more but 30 angstrom or less. This is because, if the thickness is less than 5 angstrom, there is a possibility of electrical short-circuiting between the first and second magnetic layers, and because, if it exceeds 30 angstroms, the tunnel phenomenon of electron becomes hard to occur. Furthermore, desirably, it is 4 angstrom or more but 25 angstrom or less. More desirably, it is 6 angstrom or more but 18 angstrom.

Moreover, the coercive force is desirable to be 10 Oe or more but 50 Oe or less for the first magnetic layer of the magnetic thin film memory element according to the present invention. This is because since a current is caused to flow through the memory element to generate a magnetic field whereby the magnetization of the first magnetic layer is inverted, if the coercive force exceeds 50 Oe, a current necessary for inverting magnetization is increased, thereby increasing power consumption by the memory; and because the current density is reached to the limiting current one to break the electrode wire connecting the memory elements, or the memory element and the switching element. In addition, if it is less than 10 Oe, it is difficult to stably save magnetized information. Moreover, the coercive force for the second magnetic layer is desirable to exceed 50 Oe. This is because, if it has a weak coercive force, magnetization is inverted in saving or recording, so that the reproduction is not able to be carried out.

Thus, it is desirable that the coercive force for the first magnetic layer of the magnetic thin film memory element according to the present invention is set to one half or less of that for the second magnetic layer.

Since the coercive force decrease as Fe is added in Co and increases as Pt is added, it is sufficient to control the coercive force by adjusting x and y for $Co_{100-x-y}Fe_xPt_y$, for example. The coercive force can also be increased by raising substrate temperature in film formation. Thus, the coercive force may be controlled by adjusting the substrate temperature in forming the film. This approach may be combined with the above approach for adjusting the composition of ferromagnetic thin film.

In the magnetic thin film memory element of the present invention, an antiferromagnetic layer may be provided to contact the surface opposite to the non-magnetic layer of the second magnetic layer, so that the antiferromagnetic layer makes switched connection with the second magnetic layer to fix magnetization of the second magnetic layer. The switched connection with the antiferromagnetic layer makes it possible to increase the coercive force of the second magnetic layer. In this case, since the same material may be used for the first and second magnetic layers, there is no need to sacrifice the MR ratio for increasing the coercive force, so that the range is widened for selecting materials. Materials for the antiferromagnetic layer may include nickel oxide NiO, ferromanganese FeMn, and cobalt oxide CoO.

Figure 6:
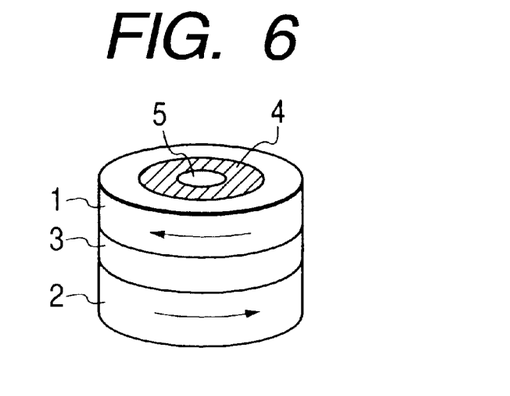
FIG. 6 is a perspective view for illustrating state of magnetization in a magnetic thin film memory element according to an embodiment of the present invention.
Figure 7:
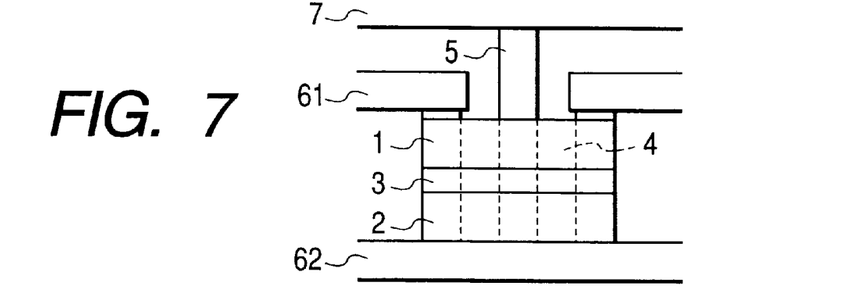
FIG. 7 is a sectional view for illustrating a structure of a magnetic thin film memory element according to an embodiment of the present invention.
Figure 8:
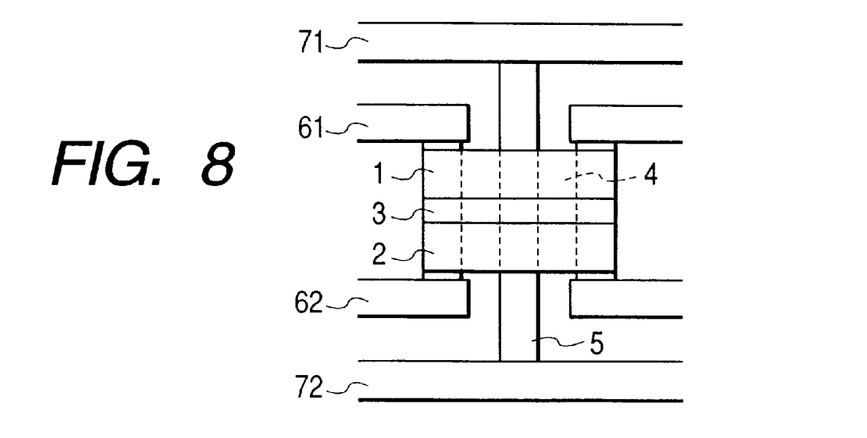
FIG. 8 is a sectional view for illustrating a structure of a magnetic thin film memory element according to an embodiment of the present invention.
Figure 9:
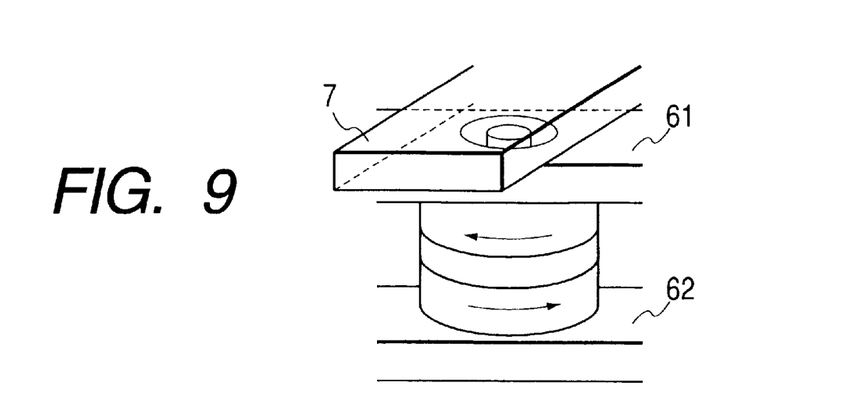
FIG. 9 is a perspective view for illustrating state of magnetization in a magnetic thin film memory element according to an embodiment of the present invention.

FIG. 6 shows another example of the magnetic thin film memory element according to the present invention. In the figure, a conductor 5 surrounded by an insulator 4 is formed at the center of the first and second magnetic layers 1 and 2. The conductor 5 is for inverting magnetization by supplying a current in recording, and has a conductivity higher than that of the magnetic layer. The insulator 4 is provided for preventing the conductor 5 from contacting the magnetic layer. FIG. 7 shows a cross sectional view of FIG. 6, in which sense lines 61 and 62 used for reproduction and a word line 7 used for recording are added to the arrangement of FIG. 6. While, in FIG. 7, the sense line 62 also functions as a resistance electrode of the word line 7, FIG. 8 shows a separately provided word line 72. The structure shown in FIG. 8 performs recording by supplying a current through the word lines 71 and 72. In reading, a resistance value of the memory element is measured by supplying a current between the sense lines 61 and 62. The sense lines 61 and 62 may be parallel or perpendicular to the word lines 71 and 72. For example, in a structure shown in FIG. 9, the sense lines 61 and 62 are parallel each other, and the word line 7 is provided to be perpendicular to them.

When comparing the structures shown in FIGS. 6, 7 and 8 to that of FIGS. 4A and 4B, they have lower wring resistance, and better power consumption and response because no current flows through the magnetic layers in recording.

When recording is performed in the magnetic thin film memory element of the present invention, state of "0" or "1"

is recorded by supplying a current perpendicular to the film surface, that is, making the current perpendicular to the magnetization orientation, and determining the magnetization orientation for the first magnetic layer with a magnetic field generated by the current. Orientation of the magnetic field being generated depends on the direction of current being supplied. For example, if the current flows through the memory element from the top to the bottom, the magnetic field is generated in the clockwise direction when viewed from the above, so that the magnetization is clockwise. On the other hand, if the current flows from the bottom to the top, the magnetization is counterclockwise. In the magnetic thin film memory element of the present invention, the first magnetic layer has a lower coercive force, and the second magnetic layer has a higher coercive force. If the magnitude of current to be supplied is set to generate a magnetic field larger than the magnetic field for inverting magnetization of the first magnetic field, data of "0" or "1" can be recorded in the first magnetic field according to the orientation of its magnetization.

In reproducing magnetized information, the magnetized information of "0" and "1" is detected by arranging the current to flow through the magnetic thin film memory element of the present invention perpendicular to the film surface, that is, to flow in an order of the first magnetic layer, the non-magnetic layer, and the second magnetic layer, or in an order of the second magnetic layer, the non-magnetic layer, and the first magnetic layer, and by measuring a resistance value between the first and second magnetic layers of the memory element. In this case, a smaller resistance value is observed if the magnetization orientation of the first and second magnetic layers is in parallel, while a larger resistance value is observed if it is in anti-parallel. Since the magnetization of the second magnetic layer is previously fixed in a predetermined direction, the resistance value varies according to the magnetization recorded in the first magnetic layer, so that information can be read.

Figure 19A:
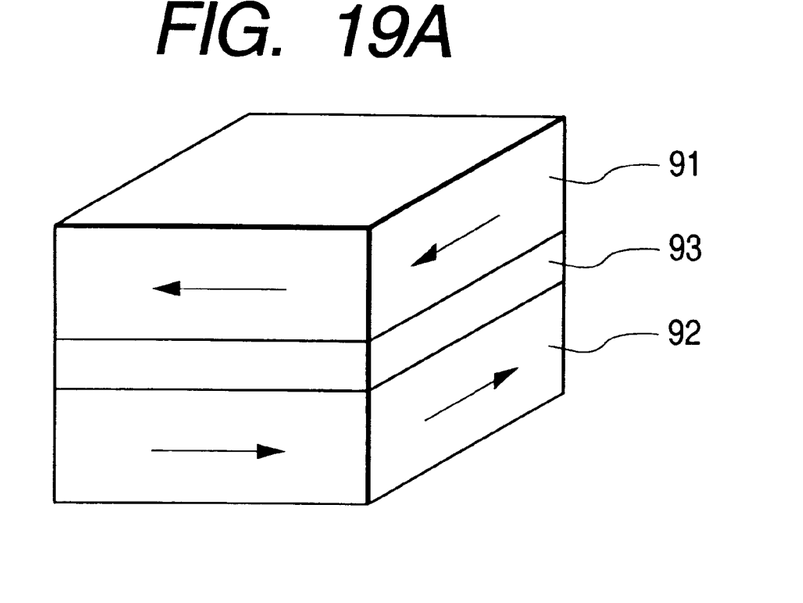
FIGS. 19A and 19B are perspective views for illustrating a thin magnetic film memory element according to an embodiment of the present invention.
Figure 19B:
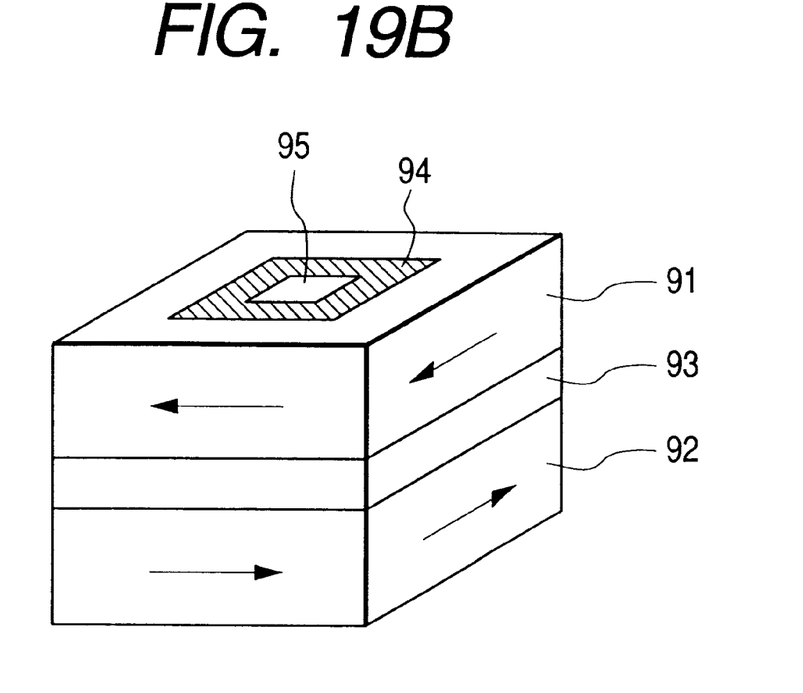

The magnetic layer may have not only the cylindrical shape but also a structure having a section in the shape of a square, provided the magnetization is oriented so as to form a closed magnetic circuit. For example, the magnetic layer may have not only such a shape as shown in FIG. 4A and FIG. 6 but also such a structure as shown in FIGS. 19A and 19B, respectively. In FIGS. 19A and 19B, there are shown a first magnetic layer 91, a second magnetic layer 92, non-magnetic layer 93, insulating layer 94, and writing line 95. The magnetic layer may have not only the shape of a square but also a shape of polygon. The cylindrical shape is more suitable for the magnetic layer because it provides the most stable closed magnetic circuit.

In the above-mentioned examples, the first magnetic layer having a low coercive force is used as a memory layer saving information, and the second magnetic layer having a high one is used as a layer wherein a magnetization orientation is constant, i.e. the pin layer. However, the second magnetic layer may be used as the memory layer saving information, and the first magnetic layer as a detecting layer to read out information on the second magnetic layer. Such a detecting layer is set so as to inverse the magnetization in two-orientations and detect a resistance variation generated at the inversion.

In the constitution of the detecting layer/the non-magnetic layer/the memory layer, the coercive force of the second magnetic layer is preferably 10 Oe or more but 50 Oe or less; and that of the first magnetic layer is preferably 2 Oe or more and the half of the coercive force of the second magnetic layer or less.

In the above-mentioned examples, there are descriptions as to the memory element, mainly. As shown in the descriptions, the element of the present invention is characterized in that even if the element is microstructurized, a high MR ratio can be realized in the element. Accordingly, the present invention may be applied to the magnetic head of a hard disk, a magnetic sensor and so forth.

Experiment A

NiFe of thickness τ as the first magnetic layer 1, $Al_2O_3$ 10 Å in thickness as the non-magnetic layer 3, and Co of thickness τ as the second magnetic layer 2 were made to build up on a Si substrate in this order to form magnetic thin film memory elements of the present invention having a constitution of FIG. 5A, varying the thickness τ of the magnetic layer from 10 Å to 10000 Å. The spin tunnel element portion comprised of NiFe, $Al_2O_3$ and Co was finely processed by a focus ion beam to obtain a cylindrical shape of about 0.8 µm diameter. A current was applied between electrodes 6 and 7, to measure the resistance value in each case that the orientation of the two magnetic layers is in parallel and that it is in anti-parallel. MR ratio was defined as (maximum resistance value - minimum resistance value) / minimum resistance value. The results are shown in "Experiment A" column of Table 1. As shown in the result, while the magnetic layers in a range of 110 Å to 5000 Å in thickness τ have MR ratio of 15% or more, the magnetic layers in the other range of thickness τ have MR ratio less than 10%. The magnetic layers in a range of 110 Å to 1000 Å in thickness τ have MR ratio of 20% or more.

Comparative Experiment 1

NiFe of thickness τ as a magnetic layer, Cu 50 Å in thickness as a non-magnetic layer, and Co of thickness τ as a magnetic layer were made to build up in this order, to form a structure of FIG. 5A having a processed cylindrical portion of about 0.8 µm diameter of the spin scattering film, varying the thickness of the magnetic layer in the same manner as in the above Experiment. The spin scattering film means a giant magnetic resistance film wherein the non-magnetic layer consisting of a good conductor sandwiched between two magnetic layers. The results of MR ratio measurement in the resulting elements are shown in "Comparative experiment 1" column of Table 1.

Comparative Experiment 2

Spin tunnel films of FIG. 1 having an open magnetic circuit constitution having the processed portion of about 0.8 µm in diameter, in which the magnetic circuit was not closed, were prepared in a way of making NiFe of thickness τ as SM, $Al_2O_3$ 15 Å in thickness as NM, and Co of thickness τ as HM build up, varying the thickness of the magnetic layer in the same manner as in the above. The results of MR ratio measurement in the resulting elements are shown in "Comparative experiment 2" column of Table 1.

Comparative Experiment 3

Spin scattering films of FIG. 1 having an open magnetic circuit constitution, in which the magnetic circuit was not closed, were prepared in a way of making NiFe of thickness τ as SM, Cu 50 Å in thickness as NM, and Co of thickness τ as HM build up and processing the portion so as to have a length of about 0.8 µm, varying the thickness of the magnetic layer in the same manner as in the above. The results of MR ratio measurement in the resulting elements are shown in "Comparative experiment 3" column of Table 1.

As shown in Table 1, the spin tunnel element of the present invention has a higher MR ratio compared with the spin scattering elements, even if the magnetic layers are thickened, particularly. Further, the decrease of MR in the open magnetic circuit constitution is remarkable in the cases wherein the thickness of the magnetic layer is 100 Å or more. The cause of it seems to be that the anti-magnetic field is reduced by employing the cylindrical shape and as the result the turbulence of the magnetization orientation is reduced. On the other hand, the MR ratio of the spin scattering film having the magnetic layer 100 Å or more is reduced, even if it has a cylindrical shape. This is because when the spin scattering film has a thick magnetic layer, then it is difficult to cause the magnetic resistance effect itself.

Accordingly, the effect of the reducing of anti-magnetic field by the cylindrical type is notable in the spin tunnel film rather than the spin scattering one. As the result, it is clarified that subject to the spin tunnel film, the cylindrical structure can exhibit the effect and be a device capable of accommodating with the high integration.

TABLE 1

| Thickness of Magnetic Layer τ (Å) | MR ratio (%) Experiment A spin tunnel cylindrical type | MR ratio (%) Comparative experiment 1 spin scattering cylindrical type | MR ratio (%) Comparative experiment 2 spin tunnel open magnetic circuit | MR ratio (%) Comparative experiment 3 spin scattering open magnetic circuit |
| --- | --- | --- | --- | --- |
| 10 | 1 | 1 | 1 | 1 |
| 30 | 5 | 3 | 5 | 3 |
| 50 | 10 | 5 | 10 | 5 |
| 90 | 11 | 6 | 11 | 6 |
| 110 | 20 | 2.5 | 11 | 1.5 |
| 150 | 21 | 1.1 | 10 | 1.1 |
| 200 | 20 | 1 | 5 | 0.5 |
| 300 | 21 | 0.6 | 0 | 0 |
| 500 | 22 | 0 | 0 | 0 |
| 1000 | 22 | 0 | 0 | 0 |
| 2000 | 18 | 0 | 0 | 0 |
| 3000 | 18 | 0 | 0 | 0 |
| 4000 | 15 | 0 | 0 | 0 |
| 5000 | 15 | 0 | 0 | 0 |
| 6000 | 8 | 0 | 0 | 0 |
| 7000 | 8 | 0 | 0 | 0 |

[Second Embodiment]

Figure 10:
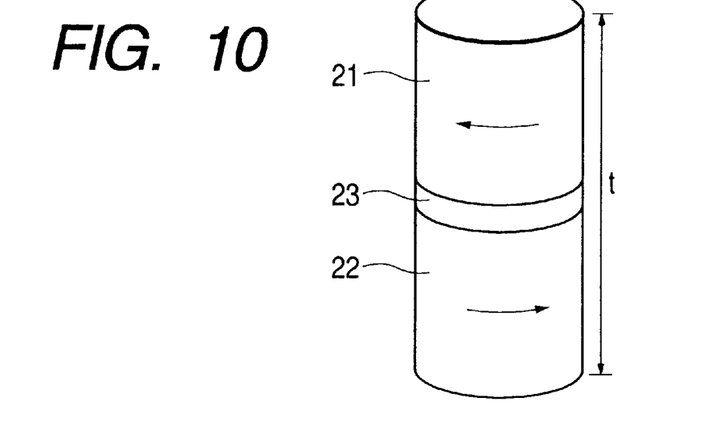
FIG. 10 is a second embodiment of a magnetic thin film memory element according to the present invention.

Now, another embodiment of the present invention is described in detail with reference to the drawings. FIG. 10 shows an arrangement of another embodiment of the magnetic thin film memory element according to the present invention. In the figure, there is shown a first cylindrical magnetic layer 21 and a second cylindrical magnetic layer 22. A non-magnetic layer 23 is provided between the first and second magnetic layers 21 and 22. A memory element of one bit cell is constituted by the first and second magnetic layers 21, 22, and the non-magnetic layer 23 of FIG. 10. The first and second magnetic layers 21 and 22 have the axis of easy magnetization in the clockwise or counterclockwise direction, and their magnetization is annularly oriented along the shape of cylinder. Arrows in FIG. 10 shows the magnetization orientation of the first and second magnetic layers 21 and 22, respectively. Here, the magnetic layer is not limited to the cylindrical shape, but may employ a structure with a rectangular cross section as long as the magnetization is oriented in a closed magnetic circuit. However, the cylindrical structure is desirable because it provides the most stable closed magnetic circuit.

In addition, resistance between the first and second magnetic layers 21 and 22 exhibits a lower resistance value if the magnetic orientations of the first and second magnetic layers 21 and 22 are in the same direction, and a higher resistance value if they are in the opposite direction. Thus, the memory element has a different resistance value depending on the magnetization orientation of the first magnetic layer 21, so that this may be utilized to read recorded magnetized information. In addition, magnetized information of "0" or "1" is recorded in accordance with the clockwise or counterclockwise magnetic orientation of the first and second magnetic layers 21 and 22. That is, current is upwardly or downwardly supplied perpendicular to the film surface of the first and second magnetic layers 21 and 22 (t direction in FIG. 10), whereby recording is performed by inverting the magnetization of the first or second magnetic layer 21 or 22 with the generated magnetic field. The methods for recording and reproducing information will be described later. Since, in the embodiment, the first and second magnetic layers 21 and 22 are structured in a closed magnetic circuit, the effect of anti-magnetic field can be eliminated, so that magnetized information can be stably recorded. Therefore, the cell width for one bit can be narrowed, whereby a highly integrated memory device can be realized. In addition, there is no leakage of a leak magnetic field to adjacent cells, whereby recording and reproduction can be stably performed.

Figure 11:
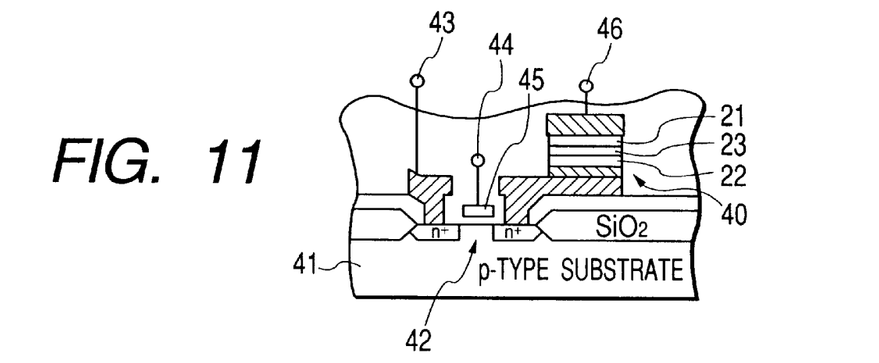
FIG. 11 is an example of a memory which is constituted by using the magnetic thin film memory of FIG. 10.

FIG. 11 is an example of case where a memory is actually constructed by using the memory element of FIG. 10. In FIG. 11, first, the memory element 40 consisting of the first and second magnetic layers 21, 22 and the non-magnetic layer 23 is mounted on a semiconductor substrate 41 in pair with a driving transistor 42. The semiconductor substrate is made of, for example, a p-type semiconductor, with the source and drain regions being of an n-type semiconductor. The driving transistor has, for example, a source terminal 43 and a gate terminal 44, with a drain terminal being electrically connected with, for example, the memory element. It also has a control gate 45. The other end of the memory element is connected to a source voltage (VDD) 46. The direction of current through the memory element is changed by changing over the polarity of VDD according to record information, thereby recording "1" and "0" of the magnetized information. A large number of memory elements and driving transistors are longitudinally and laterally arranged on the semiconductor substrate, and integrated as a highly integrated magnetic thin film memory.

Here, in this embodiment, when information is recorded, the memory element is divided into two types whether the magnetization is inverted for the first magnetic layer 21 or the second magnetic layer 22. The first type is an arrangement comprised of a memory layer (first magnetic layer 21), a non-magnetic layer 23, and a pin layer (second magnetic layer 22). This is a case where the first magnetic layer 21 is used as a memory layer for saving magnetized information, and the second magnetic layer 22 is used as a pin layer for continuously maintaining constant its magnetization orientation in the saving, recording and reproducing state without depending on the magnetized information. In this case, it is the magnetization of the first magnetic field 21 that is inverted by the recording current. The reproduction of information is performed by detecting an absolute value without inverting the magnetic layer, as described later.

The second type is an arrangement comprised of a detection layer (first magnetic layer 21), the non-magnetic layer 23, and a memory layer (second magnetic layer 22). This is a case where the first magnetic layer 21 is used as a detection layer for performing inversion for relative detection in reading, and the second magnetic layer 22 is used as a memory layer for saving magnetized information. In this case, it is the magnetization of the second magnetic layer 22 that is inverted by the recording current. In both case, it is necessary that the first magnetic layer 21 has a lower coercive force, and the second magnetic layer 22 has a coercive force higher than the first magnetic layer 21.

Then, the magnetic thin film memory element of this embodiment can perform sufficiently stable recording by increasing the length t of a current path through which the recording current flows. This is also true for both the first and second types, and for the spin tunnel film arrangement and the spin scattering film arrangement, which will be described later. Now, a concrete arrangement of the memory element will be described. First, to record information in the memory element, it is desirable to generate a magnetic field of at least 5 Oe, and more desirably 10 Oe. This is because, if the magnetic field is too small, it becomes necessary to decrease the coercive force of the magnetic thin film memory element, which makes it difficult to stably hold recorded information. It is sufficient to supply a high current to obtain a large magnetic field. However, if it exceeds the limiting current density for wiring material, there arises electromigration, which tends to break wiring. In addition, if the current value increases, the memory element consumes much power.

Figure 12:
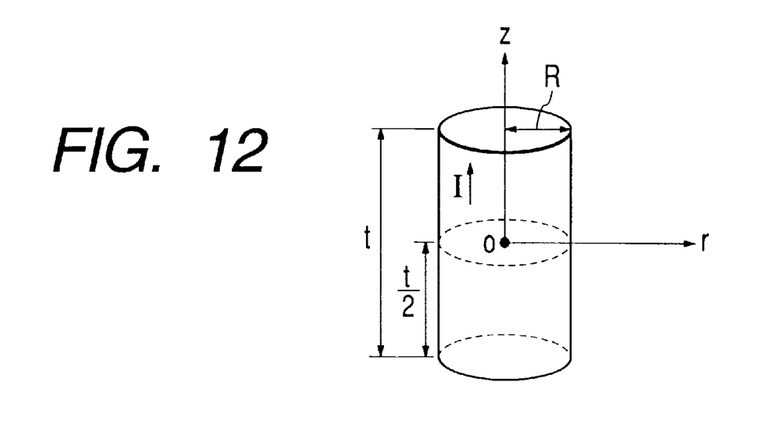
FIG. 12 is a schematic view of a cylindrical current path.
Figure 13:
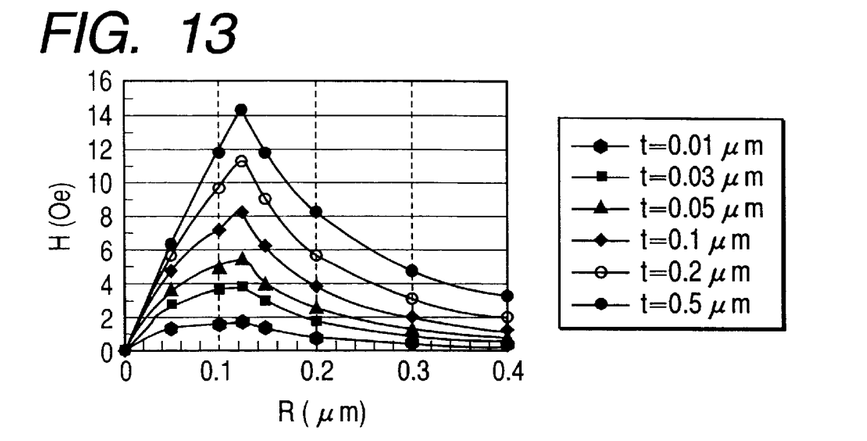
FIG. 13 is graphs of relationship between the radius of current path in FIG. 12 and magnetic fields, with the length of current path as a parameter.

The limiting current density is 20 mA/$\mu$m$^2$ for a tungsten wire which has a relatively high limiting current density among wiring materials used for a semiconductor device. In addition, about 1 mA or less is a desirable current for suppressing increase of power consumption and heat generation in the device. Here, FIG. 12 shows the above-mentioned tungsten wire as a cylindrical conductor with a radius R and a length t. FIG. 13 shows a relationship between the radius R of the conductor shown in FIG. 12 and a magnetic field when a current is supplied in the direction of the height t in the conductor. Here, FIG. 13 plots the generated magnetic field H to the radius R with the length t of the conductor as a parameter. The length of conductor t is 0.01, 0.03, 0.05, 0.1, 0.2 and 0.3 $\mu$m.

Figure 14:
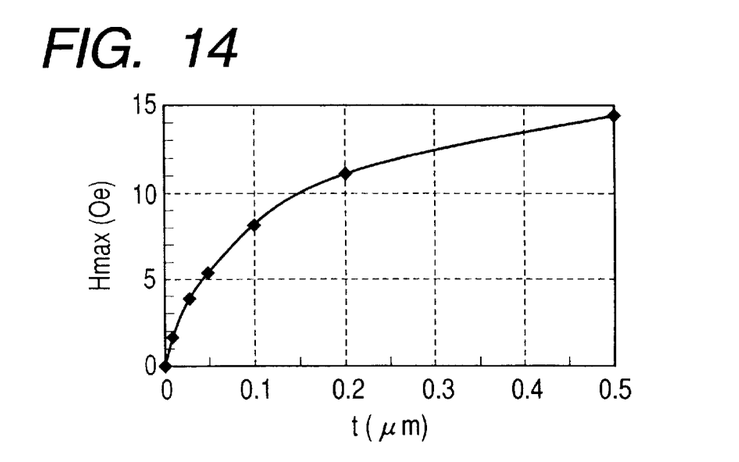
FIG. 14 is a graph of relationship between the length of current path in FIG. 12 and the generated maximum magnetic fields.

Then, FIG. 14 shows a relationship between the length of conductor t and the maximum magnetic field Hmax. As seen from FIGS. 13 and 14, the length t of current path requires at least 0.05 $\mu$m to obtain a magnetic field of 5 Oe or more required for recording. In addition, as seen from FIG. 13, longer length t of the current path can widen the available range of radius R of the current path, so that the margin can be increased in mounting the memory element. From the above result, a length of 0.05 $\mu$m is required for the length t of the current path to generate the magnetic field of 5 Oe required for recording, more preferably 0.1 $\mu$m or more, still preferably 0.15 $\mu$m or more, and still preferably 0.2 $\mu$m or more. In addition, if the length t of current path is made too long, it increases the film thickness, which not only takes much time for film formation, but also may cause the memory element not to become perpendicular but incline with respect to the semiconductor substrate of FIG. 11. This causes erroneous recording such as recording on an adjacent memory element. Thus, the length t of current path is 2 $\mu$m or less, preferably 1 $\mu$m or less, more preferably 0.5 $\mu$m or less. Therefore, the length t of current path of the memory element of FIG. 10 is sufficient to be 0.05 $\mu$m or more, but 2 $\mu$m or less.

Figure 15:
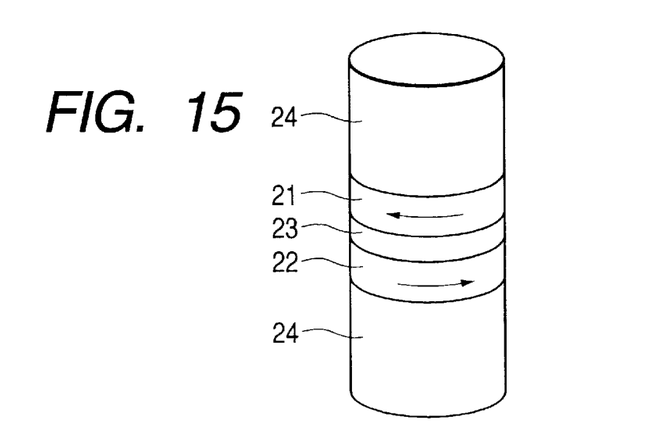
FIG. 15 is another embodiment of the present invention.

FIG. 15 shows another embodiment of the present invention. While the current path for recording is constituted in the embodiment of FIG. 10 by the first magnetic layer 21, the non-magnetic layer 23, and the second magnetic layer 22, this embodiment is further provided with a good conductor 24. That is, in the case where the film thickness cannot be increased for the first and second magnetic layers 21 and 22, the length of current path is secured by providing the good conductor 24. A material with conductivity higher than the first and second magnetic layers 21 and 22 is used as the good conductor 24, whereby recording is performed in the first and second magnetic layers 21 and 22 by perpendicularly supplying a current to the memory element of FIG. 15. The good conductor 24 may be provided on both the end surfaces of the first magnetic layer 21 opposite to the surface contacting the non-magnetic layer 23, and the surface of the second magnetic layer 22 opposite to the surface contacting the non-magnetic layer 23 as shown in FIG. 15, or on either one of them. Such provision of the good conductor 24 reduces resistance loss of the memory element, and power consumption.

Figure 16:
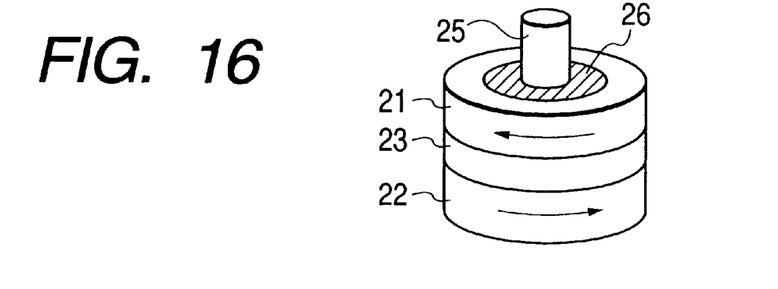
FIG. 16 is another embodiment of the present invention.

FIG. 16 shows another embodiment of the present invention. This embodiment is provided with a conductor 25 for supplying a recording current to the center of memory element. The conductor 25 is covered by an insulator 26, and a material with conductivity higher than that of the first and second magnetic layers 21 and 22 is used therefor. The insulator 26 is provided for preventing the conductor 25 from electrically contacting the magnetic layer. However, it is preferably as thin as possible because, if the insulator 26 is thick, distance between the conductor 25 and each magnetic layer is increased, thereby decreasing the magnetic field applied to the magnetic layer. Since in this embodiment a current is not supplied to the magnetic layer in recording, but supplied to the conductor 25, it is possible to reduce power consumption, and good responsibility can be provided.

Now, description is given on a specific method for recording information in the magnetic thin film memory element. First, to record information in the memory element, a current is supplied to the memory element perpendicular to the film surface of the memory element. That is, the current is supplied to be perpendicular with respect to the magnetization orientation, and the magnetization orientation of the memory layer is determined by the magnetic field generated by the current, thereby recording information of "0" and "1". In this case, since the orientation of generated magnetic field depends on the direction of current to be supplied, if, for example, the current is supplied from the top to the bottom of the memory element, the magnetic field is generated in the clockwise direction when viewing the memory element from the above, so that the magnetization is oriented clockwise. On the other hand, if the current is supplied from the bottom to the top of the memory element, the magnetic field is generated in the counterclockwise direction when viewed from the above, so that the magnetization is oriented counterclockwise.

When information is actually recorded, the recording method differs for the above-mentioned first type, "memory layer (first magnetic layer 21), non-magnetic layer 23, and pin layer (second magnetic layer 22)" and the second type, "detection layer (first magnetic layer 21), non-magnetic layer 23, memory layer (second magnetic layer 22)". In the arrangement of first type, information of "0" and "1" can be recorded on the memory layer (first magnetic layer 21) depending on the orientation of magnetization by setting the magnitude of current to be supplied to generate a magnetic field smaller than the magnetization inverting magnetic field of the pin layer (second magnetic layer 22), but larger than the magnetization inverting magnetic field of the memory layer (first magnetic layer 21). Moreover, in the case of second type, information of "0" and "1" can be recorded depending on the orientation of magnetization by setting the magnitude of current to be supplied to generate a magnetic field larger than the magnetization inverting magnetic field of the memory layer (second magnetic layer 22).

Now, description is given on a specific method for reproducing information recorded in the magnetic thin film memory element. First, information is reproduced by supplying a current in a direction perpendicular to the film surface of the memory element in an order of the first magnetic layer 21, the non-magnetic layer 23 and the second magnetic layer 22, or of the second magnetic layer 22, the non-magnetic layer 23 and the first magnetic layer 21. Then, the magnetized information of "0" and "1" is detected by measuring a resistance value between the first and second magnetic layers 21 and 22 of the memory element. That is, the resistance value between the first and second layers 21 and 22 is small if the magnetization orientation of the first and second magnetic layers 21 and 22 is in the same direction, and large if they are opposite, whereby the information is determined by this difference of resistance values. Alternatively, difference of resistance values is similarly detected by supplying the current in a direction horizontal with respect to the film surface of the memory element.

Moreover, the reading method differs for the first and second types of the memory element. In the case of the first type, a resistance value between the first and second magnetic layers 21 and 22 is measured by supplying a reading current smaller than that in recording in a direction perpendicular to the film surface of the memory element. In this case, since the magnetization of the second magnetic layer 22 is previously fixed in a predetermined direction, the resistance value between the first and second magnetic layers 21 and 22 varies in correspondence to the magnetization orientation recorded in the first magnetic layer 21, and the recorded information is reproduced with the resistance value. Here, in this case, there is no need to invert the magnetization of magnetic layer.

On the other hand, there are three reading methods for the second type. The first method is to align and initialize magnetization of the detection layer (first magnetic layer) in a predetermined direction by supplying a current in a direction perpendicular to the film surface of the memory element, and inverting the detection layer (first magnetic layer). Then, the resistance value between the first and second magnetic layers 21 and 22 is measured by supplying in a direction perpendicular to the film surface of the memory element a weak reading current in a magnitude not to invert the detection layer. This method is effective for an element in which the detection layer has a small coercive force and its magnetization is randomly oriented.

Another one is to initially measure the resistance value of the memory element, then supply a current in a direction perpendicular to the film surface of the memory element to orient the magnetization of the detection layer in a predetermined direction, and further measure the resistance value of the memory. The magnetized information in the memory element can be detected by whether or not the resistance varies in this case. This method is established so as to make the magnetization orientation of the detection layer and the memory layer be in a predetermined relationship after completion of recording. For example, the detection layer and the memory layer are arranged so that their parallel magnetized state is stable with the magnetic interaction, and the resistance value initially measured is that in the parallel magnetized state. This is attained by, for example, providing the non-magnetic layer with a film thickness of about 10 Å to 20 Å in the spin tunnel type.

The last one is to supply a current from one direction to the memory element in a direction perpendicular to the film surface, and read resistance variation between the first and second magnetic layer 21 and 22. Then, a current is supplied to the memory element in the direction opposite to the above direction, whereby variation of resistance between the first and second magnetic layers 21 and 22 is read, and the recorded information is determined with the resulting resistance variation. The current should have a magnitude enough to invert only the detection layer. In any method, it is necessary for the memory layer (second magnetic layer) not to be inverted.

This embodiment employs the CPP (Current Perpendicular to the film Plane)—MR (Magneto-Resistance) effect in which the current is caused to flow perpendicular to the film surface in reproduction, as described above, or the CIP (Current In-Plane to the film Plane)—MR effect in which a current is caused to flow parallel to the film surface. Here, in the above, in the memory elements shown in FIGS. 10 and 15, the current supplied perpendicular to the film surface to determine the magnetization orientation of the magnetic layer flows through the same current path as the current for measuring the resistance value of the memory element.

Figure 17:
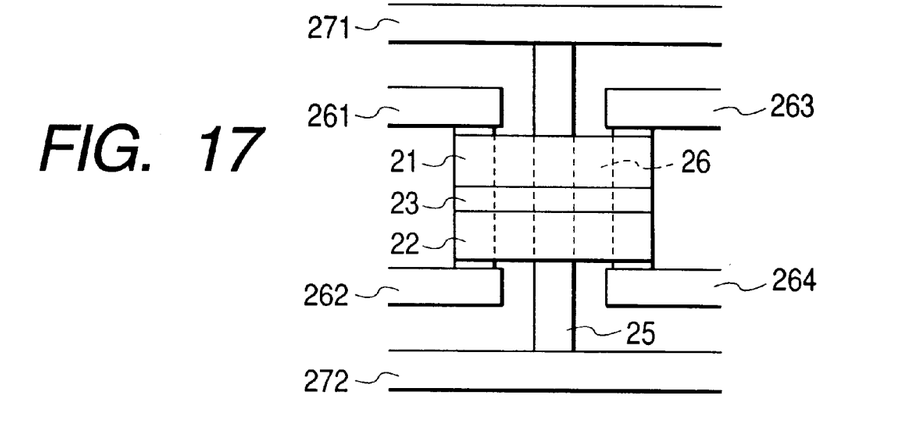
FIG. 17 is a sectional view showing a magnetic thin film memory element according the present invention.
Figure 18:
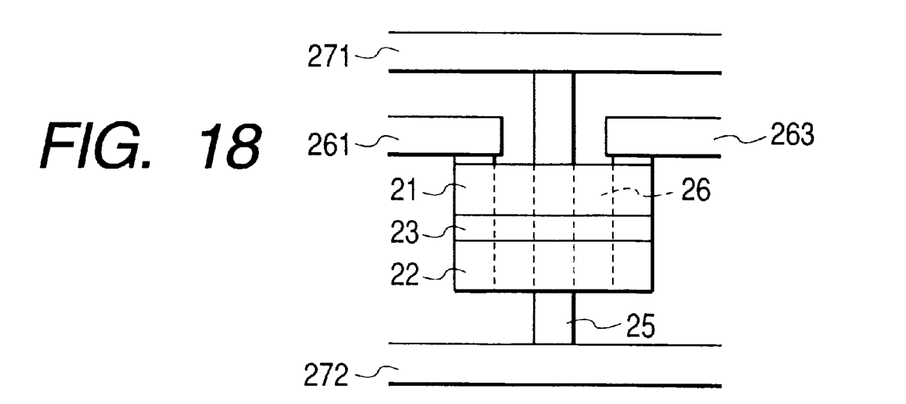
FIG. 18 is a sectional view showing a magnetic thin film memory element according the present invention.

In addition, in the arrangement of memory element shown in FIG. 16, the current for determining the magnetization orientation is caused to flow through the conductor 25, while the current for measuring the resistance value is caused to flow between the first and second magnetic layers 21 and 22. A best suitable embodiment in this case is shown in FIGS. 17 and 18. FIG. 17 shows a cross sectional view of the memory element. With this arrangement, when the magnetization orientation is determined, a potential difference is provided between conductors 271 and 272 to cause a current to flow through the conductor 25. When the resistance value of the memory element is measured, a current is caused to flow between electrodes 261 and 263 consisting of a conductor provided on the top surface of the first magnetic layer 21, and electrodes 262 and 264 consisting of a conductor provided on the bottom surface of the second magnetic layer 22. This is a case of CPP detection, and used for detecting both types of the spin tunnel and the spin scattering, which will be described later.

An arrangement shown in FIG. 18 is a cross sectional view of a memory element, in which the electrodes 262 and 264 of FIG. 17 are eliminated, and a current is caused to flow through the electrodes 261 and 263 when the resistance value is measured. This is a case of CIP detection, and used for a case where the element of spin scattering type, which is described later, is detected. Since the spin scattering type element has a thin magnetic layer, and resistance is small in the CPP detection, it is desirable to use the CIP detection.

Now, there is described material for the first and second magnetic layers and the non-magnetic layer of the magnetic thin film memory element, and thickness of them. Here, it is possible to employ the spin tunnel film arrangement and the spin scattering film arrangement as the memory element film arrangement, which can be applied to both arrangements of the first type, "memory layer/non-magnetic layer/pin layer", and the second type, "detection layer/non-magnetic layer/memory layer." However, it is more desirable to use the spin tunnel film arrangement than the spin scattering film arrangement. This is because the spin tunnel film arrangement can provide a large magneto-resistance (MR) ratio, and obtains a resistance value as high as 1 kΩ or more, so that it is less sensitive to variation of on-resistance (about 1 KΩ) of the semiconductor switching element. In addition, as described later, since the spin tunnel film can provide a relatively thick magnetic layer, it can be employed for any of embodiments of FIGS. 10, 15 and 16, while the spin scattering film is difficult to provide all magnetic layers and the non-magnetic layer with a film thickness of 0.05 μm or more, and desirable to be used for the embodiment of FIGS. 15 or 16.

The first and second magnetic layers use as their primary material at least one of Ni, Fe and Co or amorphous alloy with CoFe as main component. They are a magnetic film of NiFe, NiFeCo, Fe, FeCo, Co, CoFeB or the like.

(Material of first magnetic layer)

The first magnetic layer has a lower coercive force than the second magnetic layer. Thus, for the first magnetic layer, it is desirable to use a soft magnetic film containing Ni, and, more specifically, use NiFe or NiFeCo as the main component in particular. In addition, it may be an FeCo magnetic film with much Fe composition, or an amorphous magnetic film with a lower coercive force such as CoFeB.

The atomic composition ratio of NiFeCo is, for $Ni_xFe_yCo_z$, x of 40 or more but 95 or less, y of 0 or more but 40 or less, and z of 0 or more but 50 or less, preferably, x of 50 or more but 90 or less, y of 0 or more but 30 or less and z of 0 or more but 40 or less, more preferably, x of 60 or more but 85 or less, y of 10 or more but 25 or less and z of 0 or more but 30 or less.

In addition, the atomic composition of FeCo is, for $Fe_xCo_{100-x}$, x of 50 or more but 100 or less, preferably, x of 60 or more but 90 or less. Moreover, the atomic composition of CoFeB is, for $(Co_xFe_{100-x})_{100-y}B_y$, x of 86 or more but 93 or less, and y of 10 or more but 25 or less, preferably.

(Material of second magnetic layer)

The second magnetic layer has a higher coercive force than the first magnetic layer. For example, it is desirable to be a magnetic film containing much Co than the first magnetic layer. $Ni_xFe_yCo_z$ suitably contains, in the atomic composition, x of 0 or more but 40 or less, y of 0 or more but 50 or less, and z of 20 or more but 95 or less, preferably, x of 0 or more but 30 or less, y of 5 or more but 40 or less and z of 40 or more but 90 or less, more preferably, x of 5 or more but 20 or less, y of 10 or more but 30 or less and z of 50 or more but 85 or less. $Fe_xCo_{100-x}$ suitably contains, in the atomic composition, x of 0 or more but 50 or less. In addition, an additional element such as Pt may be added in the second magnetic layer for the purpose of control of coercive force and improvement of corrosion resistance.

In the case of the spin tunnel film arrangement, a thin insulating layer is used as the non-magnetic layer 23 between the first and second magnetic layers 21 and 22, so that the tunnel effect occurs from the first magnetic layer 21 to the second magnetic layer 22 when a current is supplied perpendicular to the film surface in reproduction. As such, in the magnetic thin film memory element of spin tunnel type, since conduction electrons cause spin polarization in a ferromagnetic metal, upward spin and downward spin have different electron state on the Fermi surface. When a ferromagnetic tunnel junction consisting of a ferromagnetic material, an insulating material and a ferromagnetic material is constituted from such ferromagnetic metal, the conduction electron tunnels while maintaining its spin, so that the tunnel probability varies depending on the state of magnetization of both magnetic layers 21 and 22, which appears as variation of tunnel resistance. Thus, the resistance value between the first and second magnetic layers 21 and 22 becomes small when the magnetization orientation of the first and second magnetic layers 21 and 22 is in the same direction, and becomes large when it is in the opposite direction.

Since larger difference between the upward and downward spins in state density increases the resistance value, and a lager reproduction signal is obtained, it is desirable to use a magnetic material with high spin polarizability for the first and second magnetic layers 21 and 22. Specifically, Fe with much polarization of upward and downward spins on the Fermi surface is chosen for the first and second magnetic layers 21 and 22, and Co is chosen as a secondary component. More specifically, it is desirable to choose and use a material containing Fe, Co or Ni as primary component. Preferably, it is Fe, Co, FeCo, NiFe, and NiFeCo. Specifically, it includes Fe, Co, $Ni_{72}Fe_{28}$, $Ni_{51}Fe_{49}$, $Ni_{42}F_{58}$, $Ni_{25}Fe_{75}$, $Ni_9Fe_{91}$ and the like. In addition, NiFe, NiFeCo or Fe is desirable for the first magnetic layer 21 to decrease the coercive force, and a material containing Co as the main component is desirable for the second magnetic layer 22.

Then, the first and second magnetic layers 21 and 22 of the magnetic thin film memory element desirably have a film thickness of more than 100 Å but 5000 Å or less. This is because, first, when an oxide is used for the non-magnetic layer 23, magnetism at the interface of the magnetic layer close to the non-magnetic layer is weakened due to the effect of the oxide, and this effect is high when the film is thin. Second, when the aluminum oxide non-magnetic layer is formed by forming a film of Al and then introducing oxygen for oxidization, aluminum remains several tens angstrom, and this effect becomes significant when the magnetic layer is 100 Å or less, so that suitable memory characteristic cannot be obtained. Third, particularly when the memory element is miniaturized to a submicron order, there is caused attenuation for the memory holding capability of the first magnetic layer 21, and the capability for holding constant magnetism for the second magnetic layer 22. In addition, since there arises too high resistance value of cell if it is too thick, it is desirable to be 5000 Å or less, and, more desirably, to be 1000 Å or less.

Next, material for the non-magnetic layer 23 is described. First, it uses the magneto-resistance effect with spin tunneling. Thus, the non-magnetic layer 23 must be an insulating layer so that electrons tunnel while maintaining their spin. The non-magnetic layer 23 may be entirely or partially an insulating layer. The magneto-resistive effect can be further increased by constituting the non-magnetic layer partially with an insulating layer to minimize its thickness. In addition, the case where the non-magnetic layer 23 is an oxide layer which is constituted by oxidizing a non-magnetic metal film includes a case where a part of Al film is oxidized in the air to form an $Al_2O_3$ layer. The non-magnetic layer 23 is made of an insulating material, preferably, aluminum oxide AlOx, aluminum nitride AlNx, silicon oxide SiOx, and silicon nitride SiNx. In addition, NiOx may be used as the main component. This is because a suitable potential barrier is need to exist in the conduction electrons in the first and second magnetic layers 21 and 22 for causing the spin tunnel, and the barrier can be relatively easily obtained if NiOx is used as the main component, which is advantageous in manufacturing.

In addition, the non-magnetic layer 23 desirably has a uniform film thickness of about several tens angstrom, and its insulating region desirably has a film thickness of 5 Å or more but 30 Å or less. That is, if it is less than 5 Å, there arises a possibility of electrical short-circuiting between the first and second magnetic layers 21 and 22, and, if it exceeds 30 Å, the tunnel phenomenon of electron becomes hard to occur. Moreover, it is desirable to be 4 Å or more but 25 Å or less, and more desirable to be 6 Å or more but 18 Å or less.

Next, the spin scattering film arrangement uses the magneto-resistance effect generated by spin dependent scattering. To obtain the magneto-resistance effect by the spin dependent scattering, it is suitable to use a metal layer of good conductor as the non-magnetic layer 23. The magneto-resistance effect by the spin dependent scattering is caused from the fact that scattering of conduction electron significantly differs depending on its spin. That is, resistance value becomes small for the conduction electron with spin in the same orientation as the magnetization because it is not much scattered, while scattering increases resistance of the electron with spin in the opposite orientation. Thus, if the magnetization of the first and second magnetic layers 21 and 22 is in the opposite orientation, it provides a larger resistance value than in the case where it is in the same orientation.

There is described the first and second magnetic layers 21 and 22, and the non-magnetic layer 23 in the spin dependent scattering film arrangement. The first magnetic layer 21 is to form an annular loop together with the second layer, and to read magnetized information saved on the second magnetic layer 22 utilizing the giant magneto-resistance effect. The first magnetic layer 21 desirably uses Ni, Fe or Co as the main component, or an amorphous alloy containing Co and Fe as main components. For example, they include a magnetic film of NiFe, NiFeCo, FeCo, CoFeB or the like. In addition, it may use an amorphous magnetic material such as CoFeB with composition such as $Co_{84}Fe_9B_7$ or $Co_{72}Fe_8B_{20}$.

The second magnetic layer 22 is a magnetic layer for mainly saving magnetized information, and its orientation of magnetization is determined according to information of "0" or "1". Similar to the first magnetic layer 21, the second magnetic layer 22 is necessary to effectively generate the giant magneto-resistance effect, and to be capable of stably maintaining the magnetized state. Used as the second magnetic layer 22 is a magnetic layer containing Fe or Co as the main component such as a magnetic film of Fe, FeCo or Co. An additional element such as Pt mat be added. Since added. Since the coercive force becomes small when Co is added in Fe, and becomes large when Pt is added, the coercive force may be controlled by adjusting element components x and y for $Co_{100-x-y}Fe_xPt_y$. Similarly, the coercive force of the first magnetic layer 21 may be adjusted with the composition ratio of Fe and Co, and amount of additional element such as Pt.

The film thickness of the first magnetic layer 21 is necessary to be established to effectively generate the giant magneto-resistive effect of scattering type. In CPP-MR, an important factor is a distance where the spin moves while maintaining its orientation, or the spin scattering length. Specifically, the film thickness of the first magnetic layer 21 is desirably at least 200 Å or less because, if it is significantly larger than the average free stroke of electron, the effect is deteriorated under the phonon scattering. More preferably, it is 150 Å or less. However, it is desirable to be 20 Å or more, more desirable to be 80 Å or more since, if it is too thin, the resistance value of cell becomes small to decrease the reproduction signal output, and the magnetization cannot be maintained.

The film thickness of the second magnetic layer 22 is necessary to be established, similar to the first magnetic layer 21, to effectively generate the giant magneto-resistive effect of scattering type, and desirable to be at least 200 Å or less. More preferably, it is 150 Å or less. However, it is desirable to be 20 Å or more, and more desirable to be 80 Å or more since, if it is too thin, the memory holding performance is deteriorated, so that the reproduction signal output is decreased, and the resistance value of cell becomes small, so that the magnetization cannot be maintained.

The non-magnetic layer 23 consists of a good conductor. It is preferable to use Cu as the main component because it has the Fermi energy level close to that of the magnetic layer and good adhesion, so that resistance tends to easily occurs at the interface when the magnetization orientation changes, which is convenient to obtain a large magneto-resistance ratio. In addition, the non-magnetic layer 23 desirably has a film thickness of 5 Å or more but 60 Å or less. In addition, if a magnetic layer containing Co as the main component is provided between the first magnetic layer 21 and the non-magnetic layer 23, or between the second magnetic layer 22 and the non-magnetic layer 23, or between the first magnetic layer 21 and the non-magnetic layer 23 and between the second magnetic layer 22 and the non-magnetic layer 23, it is desirable because it provide a high magneto-resistance ratio, so that a high S/N ratio can be obtained. In this case, the thickness of the layer with Co as the main component is preferable to be 20 Å or less, and more preferably to be 5 Å or more so that the effect can be exhibited. In addition, to improve the S/N ratio, it may be possible to constitute the first magnetic layer 21/non-magnetic layer 23/second magnetic layer 22/non-magnetic layer 23 as one unit, and to stack the unit. While a larger number of stack is desirable because a higher MR ratio can be obtained, if too many units are stacked, the MR magnetic layer becomes thick, which requires much current. Thus, it is preferable to limit the number of stack to 40 or less, more preferably, to provide about 3 to 20 stacks.

The coercive force of the first and second magnetic layers 21 and 22 is sufficient to be controlled by adjusting the element components x and y for $Co_{100-x-y}Fe_xPt_y$ because the coercive force becomes small if Fe is added in Co, and large if Pt is added. The coercive force can also be increased by raising substrate temperature in film formation. Thus, the coercive force may be controlled by adjusting the substrate temperature in forming the film. This approach may be combined with the above approach for adjusting the composition of ferromagnetic thin film.

The present invention is not limited to the arrangements of FIGS. 10, 15 and 16, but may be arranged such that an antiferromagnetic layer is provided to contact the surface of the second magnetic layer 22 opposite to the non-magnetic layer 23, and this antiferromagnetic layer makes switched connection with the second magnetic layer 22 to fix the magnetization of the second magnetic layer 22. The switched connection with the antiferromagnetic layer makes it possible to increase the coercive force of the second magnetic layer 22. In this case, since the same material may be used for the first and second magnetic layers 21 and 22, there is no need to sacrifice the MR ratio for increasing the coercive force, so that the range is widened for selecting materials. Materials for the antiferromagnetic layer may include nickel oxide NiO, ferromanganese FeMn, and cobalt oxide CoO.

Then, as described above, recording of information in the memory element is performed by a recording current for generating a magnetic field larger than the magnetization inverting magnetic field (coercive force) of the memory layer. Thus, the magnetic field required for recording depends on the coercive force of the memory layer. The inventor conducted evaluation experiments by producing memory elements with memory layers having different coercive force so as to investigate magnitude of a magnetic field necessary for recording.

With the arrangement of memory element shown in FIG. 16, I produced each 100 memory cells consisting of the conductor 25 with a diameter of 0.12 μm and a NiFe detection layer/AlOx/Co memory layer of an inner diameter of 0.14 μm and an outer diameter of 0.30 μm, and with the coercive force of 2, 4, 5, 10 and 12 Oe. "0" or "1" was recorded in those memory cells. The magnitude of magnetic field generated from the current flowing through the writing line was established to be substantially equal to or slightly higher than the coercive force of the memory layer. It was determined that the length of conductor 25 or current path was 2 μm. Subsequently, information in each cell was reproduced, and investigation was made on the number of normal cell in which the recorded information was surely held, and the number of defective cell in which the recorded information was lost.

Results are shown in Table 2. An error ratio was defined as a ratio of defective cells to the entire number of cells. The error ratio was 1% when the magnitude of magnetic field generated from the writing line current was 5 Oe, and 0% when it is 10 Oe or more. In addition, the error ratio was 50% and 90% for 2 and 4 Oe, respectively, in which information was difficult to be held. If the error ratio is at a level of about several percent, it can be made 0% by providing redundancy with addition of error correction function as a memory, so that recording and reproduction can be accurately attained. From these results, it is found that at least 5 Oe or more, desirably, 10 Oe or more is required for the writing current magnetic field.

TABLE 2

| Writing current magnetic field (Oe) | Coercive force of memory layer (Oe) | Number of normal cells | Number of defective cells | Error ratio (%) |
|---|---|---|---|---|
| 2 | 2 | 10 | 90 | 90 |
| 4 | 4 | 50 | 50 | 50 |
| 5 | 5 | 99 | 1 | 1 |
| 10 | 10 | 100 | 0 | 0 |
| 12 | 12 | 100 | 0 | 0 |

Then, the inventor conducted recording/reproduction experiments by producing the memory cells with the same arrangement as described above with different current path to investigate the upper limit of current path length. Each 100 memory cells were produced with the current path length of 0.5, 1.0, 2.0, 3.0, and 4.0 μm. "0" or "1" was recorded in those memory cells with 10 Oe of the magnitude of magnetic field generated from the current flowing through the writing line and 8 Oe of the coercive force of the memory layer. Results are shown in Table 3. The error ratio was 2 % for the writing line length of 2 μm, 1% for 1.0 μm, and 0% for 0.5 μm. The worse error ratio is supposed to be caused from erroneous recording in an adjacent cell because a long current path was provided in the direction of film thickness. It is found from these result that the necessary length of writing line is at least 2 μm or less, desirably 1.0 μm or less, more desirably 0.5 μm or less.

TABLE 3

| Length (μm) | Number of normal cells | Number of defective cells | Error ratio (%) |
|---|---|---|---|
| 0.5 | 100 | 0 | 0 |
| 1.0 | 99 | 1 | 1 |
| 2.0 | 98 | 2 | 2 |
| 3.0 | 50 | 50 | 50 |
| 4.0 | 0 | 100 | 100 |

What is claimed is:

1. A magnetic thin film memory element comprising:
   a first magnetic layer with a closed magnetic circuit structure;
   a second magnetic layer with a closed magnetic circuit structure having a coercive force higher than that of said first magnetic layer; and
   a non-magnetic layer disposed between said first and second magnetic layers, at least a part of which is made of an insulating material.

2. The magnetic thin film memory element according to claim 1, wherein
   said first and second magnetic layers contain at least one element from Fe, Co and Ni.

3. The magnetic thin film memory element according to claim 1, wherein
   said non-magnetic layer is comprised of any one of aluminum oxide, aluminum nitride, silicon oxide, or silicon nitride.

4. The magnetic thin film memory element according to claim 1, wherein
   said first and second magnetic layers have a film thickness of 100 Å or more but 5000 Å or less.

5. The magnetic thin film memory element according to claim 1, wherein
   said non-magnetic layer has a film thickness of 5 Å or more but 30 Å or less.

6. The magnetic thin film memory element according to claim 1, wherein
   the coercive force of said first magnetic layer is one half or less of that of the second magnetic layer, said first magnetic layer having the coercive force of 10 Oe or more but 50 Oe or less, said second magnetic layer having the coercive force of more than 50 Oe.

7. The magnetic thin film memory element according to claim 1, wherein
   an antiferromagnetic layer is disposed in contact with the surface of said second magnetic layer opposite to said non-magnetic layer, said antiferromagnetic layer making switched connection with said second magnetic layer, the orientation of magnetization of said second magnetic layer being fixed.

8. The magnetic thin film memory element according to claim 1, wherein
   a current path for generating a recording magnetic field is formed at the center of said first magnetic layer, said non-magnetic layer and said second magnetic layer.

9. The magnetic thin film memory element according to claim 1, wherein
   said current path is surrounded by an insulator.

10. The magnetic thin film memory element according to claim 1, wherein
    said current path has a length of 0.05 μm or more but 2 μm or less.

11. An information recording method comprising
    the step of supplying a current with different direction depending on information to said current path of the magnetic thin film memory element according to claim 8, thereby recording the information in said first magnetic layer.

12. An information reproduction method comprising
    the steps of supplying a current between said first and second magnetic layers of the magnetic thin film memory element according to claim 1, and measuring resistance, thereby reproducing information recorded on said first magnetic layer.

* * * * *